(12) United States Patent
Chang Chien et al.

(10) Patent No.: US 11,309,283 B2
(45) Date of Patent: Apr. 19, 2022

(54) PACKAGING STRUCTURE AND MANUFACTURING METHOD THEREOF

(71) Applicant: Powertech Technology Inc., Hsinchu County (TW)

(72) Inventors: Shang-Yu Chang Chien, Hsinchu County (TW); Nan-Chun Lin, Hsinchu County (TW); Hung-Hsin Hsu, Hsinchu County (TW)

(73) Assignee: Powertech Technology Inc.

( * ) Notice: Subject to any disclaimer, the term of this patent is extended or adjusted under 35 U.S.C. 154(b) by 0 days.

(21) Appl. No.: 17/099,801

(22) Filed: Nov. 17, 2020

(65) Prior Publication Data

US 2021/0202440 A1    Jul. 1, 2021

Related U.S. Application Data

(60) Provisional application No. 62/955,456, filed on Dec. 31, 2019.

(30) Foreign Application Priority Data

Feb. 26, 2020  (TW) ................. 109106328

(51) Int. Cl.
| | |
|---|---|
| *H01L 25/065* | (2006.01) |
| *H01L 23/31* | (2006.01) |
| *H01L 25/00* | (2006.01) |
| *H01L 23/538* | (2006.01) |
| *H01L 23/36* | (2006.01) |
| *H01L 23/48* | (2006.01) |

(52) U.S. Cl.
CPC ...... *H01L 25/0655* (2013.01); *H01L 23/3128* (2013.01); *H01L 23/36* (2013.01); *H01L 23/481* (2013.01); *H01L 23/5381* (2013.01); *H01L 25/50* (2013.01)

(58) Field of Classification Search
CPC .. H01L 25/0655; H01L 23/3128; H01L 23/36
See application file for complete search history.

(56) References Cited

U.S. PATENT DOCUMENTS

| | | | |
|---|---|---|---|
| 2018/0061741 | A1 | 3/2018 | Beyne |
| 2018/0294216 | A1 | 10/2018 | Kim et al. |
| 2019/0096851 | A1 | 3/2019 | Liao et al. |
| 2019/0103386 | A1 | 4/2019 | Chen et al. |

(Continued)

FOREIGN PATENT DOCUMENTS

WO    2016036667    3/2016

*Primary Examiner* — Errol V Fernandes
(74) *Attorney, Agent, or Firm* — JCIPRNET

(57) ABSTRACT

A packaging structure includes a bridge die, a through silicon via die, a first encapsulant, a first active die, a second active die, a second encapsulant, and a redistribution circuit structure. The first encapsulant covers the through silicon via die and the bridge die. The first active die is electrically connected to the bridge die and the through silicon via die. The second active die is electrically connected to the bridge die. The second encapsulant covers the first active die and the second active die. The redistribution circuit structure is electrically connected to the through silicon via die. The through silicon via die is disposed between the first active die and the redistribution circuit structure. A manufacturing method of a packaging structure is also provided.

14 Claims, 14 Drawing Sheets

(56) References Cited

U.S. PATENT DOCUMENTS

| | | |
|---|---|---|
| 2019/0304913 A1 | 10/2019 | Wu et al. |
| 2020/0027837 A1* | 1/2020 | Jeng .................... H01L 23/5389 |
| 2021/0005542 A1* | 1/2021 | Malli ...................... H01L 24/73 |
| 2021/0202336 A1* | 7/2021 | Chang ................ H01L 21/4857 |

* cited by examiner

PACKAGING STRUCTURE AND MANUFACTURING METHOD THEREOF

CROSS-REFERENCE TO RELATED APPLICATION

This application claims the priority benefits of U.S. provisional application Ser. No. 62/955,456, filed on Dec. 31, 2019 and Taiwan application serial no. 109106328, filed on Feb. 26, 2020. The entirety of each of the above-mentioned patent applications is hereby incorporated by reference herein and made a part of specification.

BACKGROUND

Technical Field

The invention relates to a packaging structure and a manufacturing method thereof, and in particular, to a packaging structure including a plurality of active dies and a manufacturing method thereof.

Description of Related Art

In recent years, electronic devices are increasingly important for human life. To accelerate the integration of various functions, a plurality of active dies may be integrated in one packaging structure. Therefore, how to improve the manufacturing yield or quality of a packaging structure including a plurality of active dies or how to reduce the manufacturing costs of a packaging structure including a plurality of active dies has actually become an urgent issue to be resolved.

SUMMARY

The invention provides a packaging structure, which has better quality.

The invention provides a manufacturing method of a packaging structure, which has a better yield or lower costs.

The packaging structure of the invention includes a bridge die, a through silicon via die, a first encapsulant, a first active die, a second active die, a second encapsulant, and a redistribution circuit structure. The first encapsulant covers the through silicon via die and the bridge die. The first active die is electrically connected to the bridge die and the through silicon via die. The second active die is electrically connected to the bridge die. The second encapsulant covers the first active die and the second active die. The redistribution circuit structure is electrically connected to the through silicon via die. The through silicon via die is disposed between the first active die and the redistribution circuit structure.

The manufacturing method of the packaging structure of the invention includes the following steps: providing a through silicon via die and a bridge die, forming a first encapsulant covering the through silicon via die and the bridge die, forming a redistribution circuit structure electrically connected to the through silicon via die, configuring a first active die electrically connected to the bridge die and the through silicon via die, configuring a second active die electrically connected to the bridge die, forming a second encapsulant covering the first active die and the second active die. After the step of forming the redistribution circuit structure and the step of configuring the first active die, the through silicon via die is disposed between the first active die and the redistribution circuit structure.

Based on the above, the packaging structure of the invention may integrate a plurality of active dies. The plurality of active dies may be electrically connected to each other by using the bridge die, and the active dies may be electrically connected by using the through silicon via die and the redistribution circuit structure. In this way, the quality of the packaging structure can be improved. Moreover, in the manufacturing method of the packaging structure, the bridge die and the through silicon via die may be first coated by using the first encapsulant, and then an active die electrically connected to the bridge die or the through silicon via die may be configured. In this way, the manufacturing yield of the packaging structure can be improved, or the manufacturing costs of the packaging structure can be reduced.

DESCRIPTION OF THE EMBODIMENTS

Figure 1A:
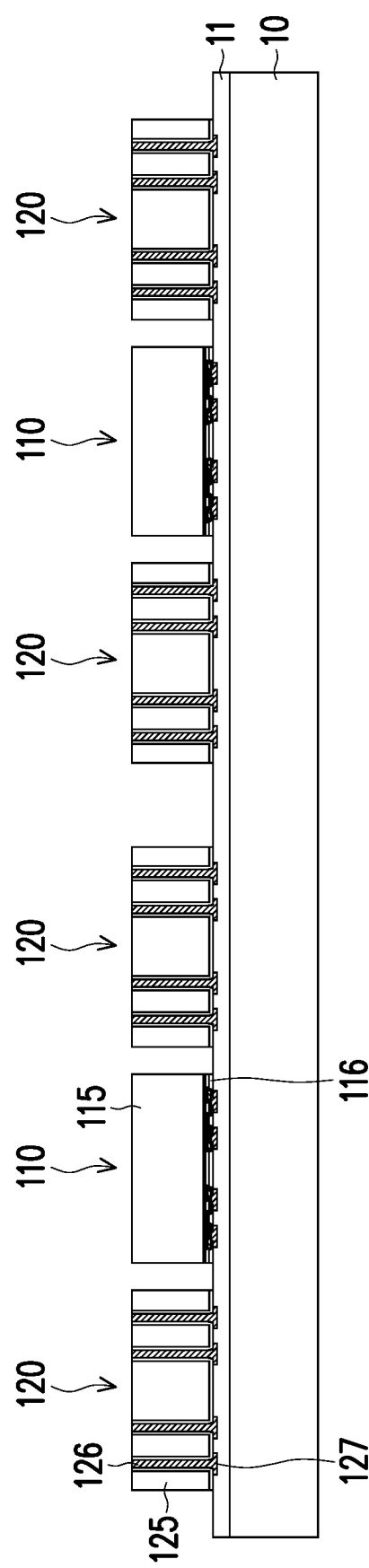
FIG. 1A to FIG. 1H are partial schematic sectional views of a partial manufacturing method of a packaging structure according to a first embodiment of the invention.

As used herein, the directional terms (such as above, below, left, right, front, back surface, top, and bottom) are merely used for ease of understanding the drawings and are not intended to indicate absolute directions. In addition, for clear representation, some films or components may be omitted in the drawings.

Unless otherwise particularly stated, any method described herein is not intended to be construed as implementing steps in a particular order.

The invention will be fully explained with reference to the drawings of the embodiments. However, the invention may also be embodied in various different forms and should not be limited to the embodiments described in the specification.

Thicknesses and sizes of layers or regions may be enlarged for clarity. Same or similar reference numerals are used to indicate same or similar elements. Details may be omitted in the description of the following sections.

FIG. 1A to FIG. 1H are partial schematic sectional views of a partial manufacturing method of a packaging structure according to a first embodiment of the invention. FIG. 1I is a partial schematic sectional view of a packaging structure according to the first embodiment of the invention. FIG. 1J is a partial schematic bottom view of a packaging structure according to the first embodiment of the invention. FIG. 1K to FIG. 1L are partial schematic sectional enlarged views of a packaging structure according to the first embodiment of the invention. FIG. 1I is, for example, a schematic sectional view corresponding to line A-A' in FIG. 1J. FIG. 1K is, for example, a schematic enlarged diagram corresponding to region R1 in FIG. 1I. FIG. 1L is, for example, a schematic enlarged diagram corresponding to region R2 in FIG. 1I. In addition, for clear representation, some films or components may be omitted in the figures. For example, FIG. 1J only exemplarily shows a part of a bridge die 110, a through silicon via die 120, a first active die 140, a second active die 150, a first conductive connector 181, a second conductive connector 182, a third conductive connector 183, a fourth conductive connector 184, a conductive terminal 189, or a passive device 191.

Referring to FIG. 1A, a through silicon via die 120 and a bridge die 110 are provided. For example, the through silicon via die 120 and the bridge die 110 may be configured on a first carrier board 10. The first carrier board 10 may be made of glass, a wafer substrate, a metal, or other suitable materials as long as the above materials can carry structures or components formed thereon in subsequent processes. In addition, the invention does not limit a quantity of the through silicon via dies 120 or the bridge dies 110 configured on the first carrier board 10. Using FIG. 1A as an example, the quantity of the through silicon via dies 120 configured on the first carrier board 10 is, for example, four, and the quantity of the bridge dies 110 configured on the first carrier board 10 is, for example, 2.

In the present embodiment, the first carrier board 10 may include a release layer 11. The release layer 11 may be a light to heat conversion (LTHC) adhesive layer, but the invention is not limited thereto.

In the present embodiment, the through silicon via die 120 may include a silicon substrate 125, a through silicon conductor (may be referred as through silicon via, TSV) 126, and a connection pad 127. The through silicon conductor 126 may penetrate the silicon substrate 125, and the through silicon conductor 126 may be electrically connected to the corresponding connection pad 127. The connection pad 127 is located on the silicon substrate 125. The through silicon via die 120 may be configured on the first carrier board 10 in a manner in which the connection pad 127 faces the first carrier board 10. With the through silicon via die 120, electronic devices located on two opposite sides of the through silicon via die 120 may be electrically connected by using the through silicon conductor 126 of the through silicon via die 120.

In the present embodiment, the through silicon via die 120 configured on the first carrier board 10 may be a known good die (KGD). For example, before the through silicon via die 120 is configured on the first carrier board 10, electrical, appearance, or other suitable inspection or test steps may be performed on the through silicon via die 120. In this way, it may be confirmed that the through silicon via die 120 configured on the first carrier board 10 has good functions, and the yield of the packaging structure 100 (marked in FIG. 1I or FIG. 1J) can be improved.

In the present embodiment, the bridge die 110 may include a silicon substrate 115 and an interconnection structure 116. The interconnection structure 116 is located on the silicon substrate 115. The bridge die 110 may be configured on the first carrier board 10 in a manner in which the interconnection structure 116 faces the first carrier board 10.

In the present embodiment, the interconnection structure 116 is, for example, a line formed by a back-end of line (BEOL) process in general semiconductor manufacture. Therefore, the line of the interconnection structure 116 may be adjusted or designed according to subsequent electrical connection requirements, so that the bridge die 110 may be more elastic in application, and lines or electrical connection points may have a better fine pitch.

In the present embodiment, the bridge die 110 configured on the first carrier board 10 may be a KGD. For example, before the bridge die 110 is configured on the first carrier board 10, electrical, appearance, or other suitable inspection or test steps may be performed on the bridge die 110. In this way, it may be confirmed that the bridge die 110 configured on the first carrier board 10 has good functions, and the yield of the packaging structure 100 (marked in FIG. 1I or FIG. 1J) can be improved.

In an embodiment, the through silicon via die 120 or the bridge die 110 does not include an active device. For example, films on the silicon substrate 115 may not construct a transistor, a diode, an integrated circuit, or an optoelectronic device. In this way, the bridge die 110 may be simpler in manufacture, inspection, or test. In an embodiment, the through silicon via die 120 or the bridge die 110 may be a passive die.

In an embodiment, an inspection step or a test step performed on the bridge die 110 and/or the through silicon via die 120 may be similar to the other die (e.g., a first active die 140, and/or a second active die 150 after-mentioned). For example, a same or similar process (e.g., recipe and/or parameter) and/or apparatus may be executed and/or operated for being performed an inspection step or a test step on the bridge die 110, the through silicon via die 120, and/or the other die. As such, the overall manufacturing process (e.g., the manufacturing process of the package structure) may be simpler or more efficient.

Figure 1B:
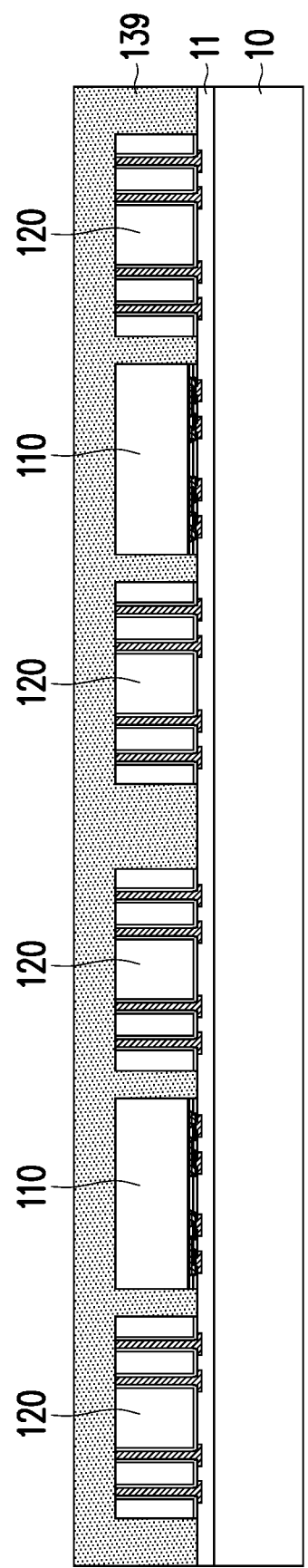
Figure 1C:
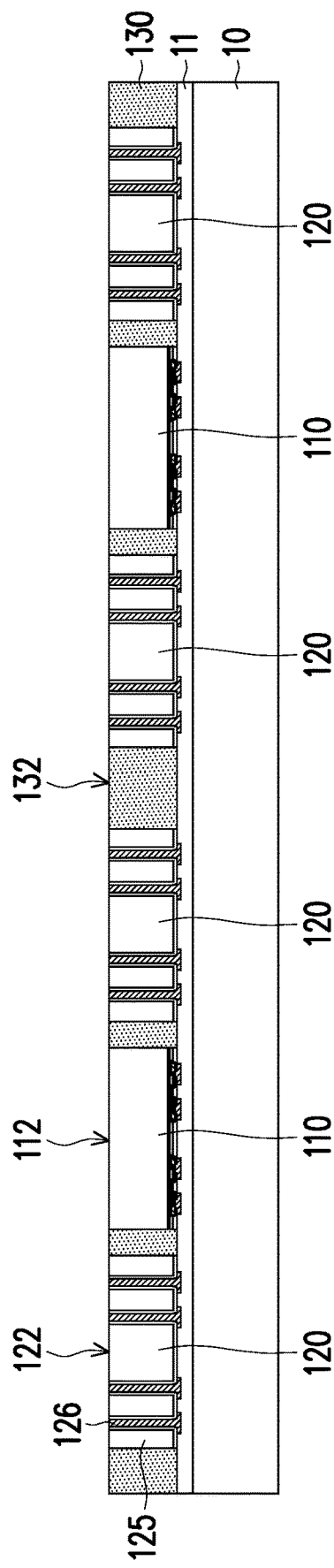

Referring to FIG. 1B to FIG. 1C, a first encapsulant 130 covering the through silicon via die 120 and the bridge die 110 is formed.

Referring to FIG. 1B, for example, a first encapsulation material 139 covering the through silicon via die 120 and the bridge die 110 may be formed. In an embodiment, the first encapsulation material 139 is, for example, a molten molding compound formed on the first carrier board 10 by using a molding process or other suitable methods. Then, the molten molding compound is cooled and solidified. In an embodiment, the through silicon via die 120 and the bridge die 110 are not be exposed outside the first encapsulation material 139, but the invention is not limited thereto.

In an embodiment, in the process of forming encapsulation material 139 (e.g., a curing process and/or a cooling process), the through silicon via die 120 and the bridge die 110 having the same or similar silicon-based structure may reduce the warpage of the structure disposed on the first carrier board 10.

Referring to FIG. 1C, for example, after the first encapsulation material 139 is formed, a first thinning process may be performed, to remove a part of the first encapsulation material 139, to form the first encapsulant 130 laterally covering the through silicon via die 120 and the bridge die 110, and expose the through silicon via die 120 and the bridge die 110.

In the present embodiment, the first thinning process includes, for example, chemical mechanical polishing (CMP), mechanical grinding, etching, or other suitable processes, but the invention is not limited thereto.

In the present embodiment, after the above first thinning process, a second connection surface 122 of the through silicon via die 120, a bridge back surface 112 of the bridge die 110, and a second encapsulation surface 132 of the first encapsulation material 139 may be substantially coplanar.

In an embodiment, in the above first thinning process, a part of the through silicon via die 120 (for example: a part of the silicon substrate 125 far away from the first carrier board 10 or a part of the through silicon conductor 126 far away from the first carrier board 10) or a part of the bridge die 110 (for example: a part of the silicon substrate 115 far away from the first carrier board 10) may be slightly removed.

Figure 1D:
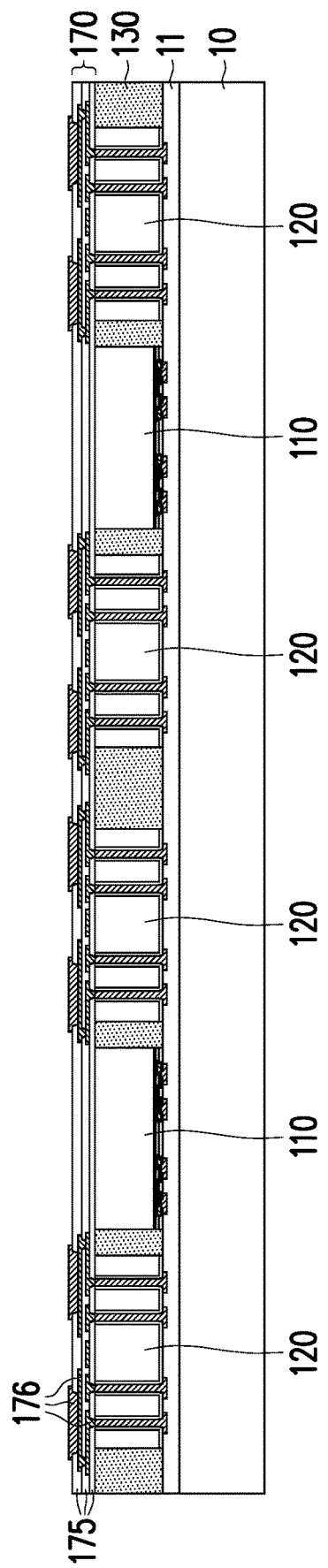

Referring to FIG. 1D, a redistribution circuit structure 170 electrically connected to the through silicon via die 120 is formed. For example, after the first encapsulant 130 is formed, the redistribution circuit structure 170 may be at least formed on the through silicon via die 120, and the redistribution circuit structure 170 may be electrically connected to the through silicon conductor 126 of the through silicon via die 120.

In the present embodiment, the redistribution circuit structure 170 may be formed on the through silicon via die 120, the bridge die 110, and the first encapsulant 130. For example, a patterned dielectric layer 175 may be formed on the through silicon via die 120, the bridge die 110, and the first encapsulant 130. The patterned dielectric layer 175 may include a plurality of dielectric layer openings, to expose a part of the through silicon conductor 126. Then, a conductive material may be formed on the patterned dielectric layer 175 by using other suitable processes such as a deposition process and/or an electroplating process. Moreover, the conductive material may be further filled in the dielectric layer openings of the patterned dielectric layer 175, to form a conductive via having conductive properties. Subsequently, the conductive material covering the patterned dielectric layer 175 may be patterned by using, for example, a lithography and etching process, to form a patterned conductive layer 176. Through a step same as or similar to the above step, at least one patterned dielectric layer 175 or at least one patterned conductive layer 176 may be formed, to construct the redistribution circuit structure 170.

Figure 1E:
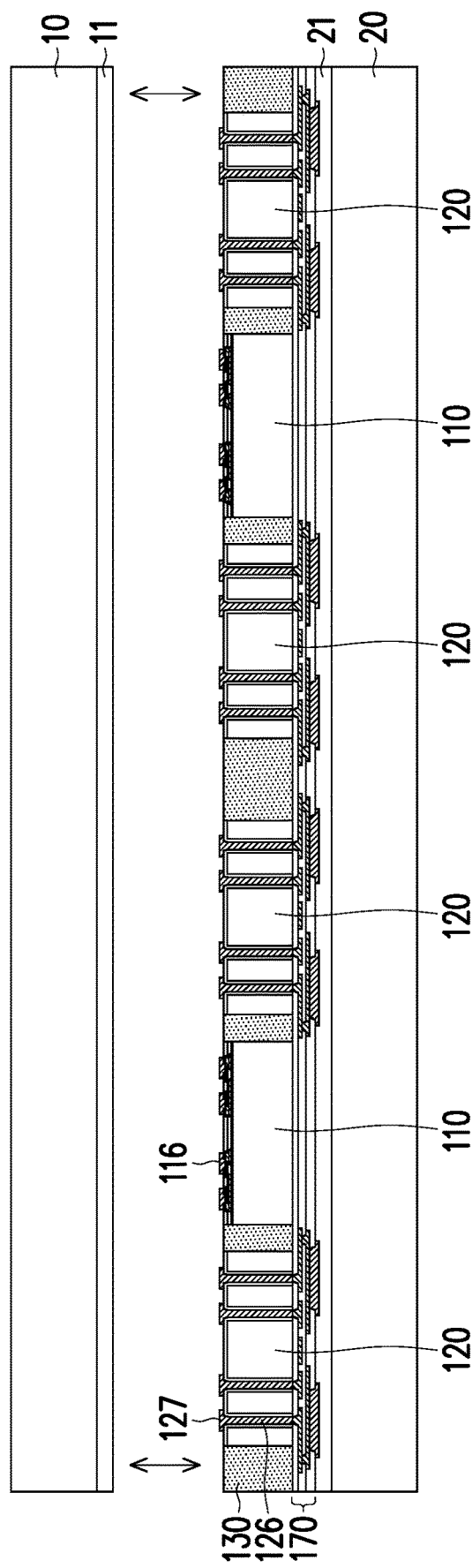
Figure 1F:
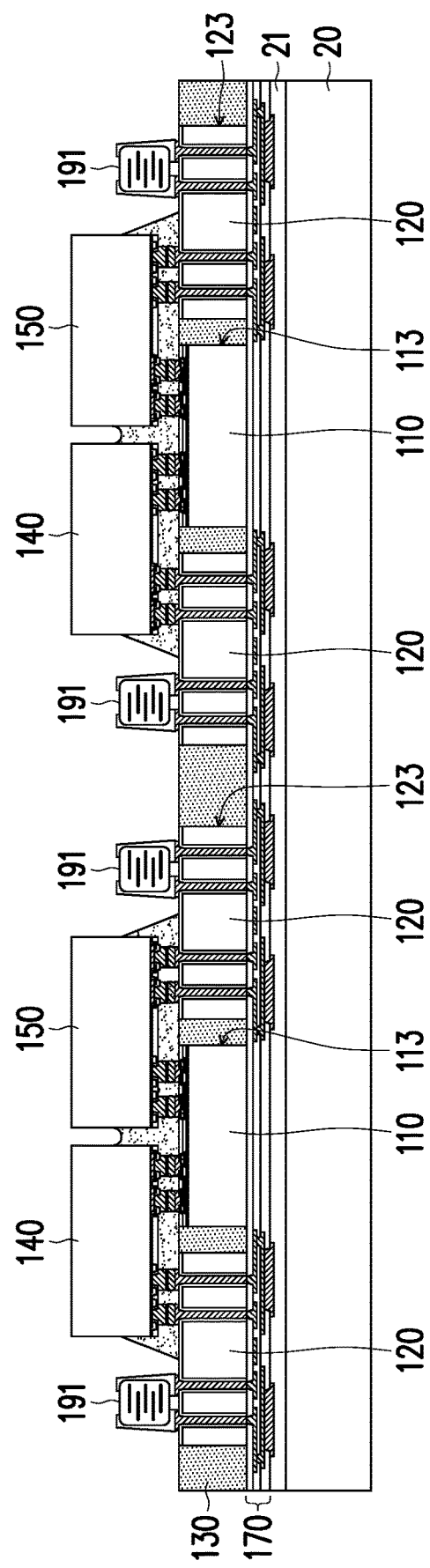

Referring to FIG. 1E to FIG. 1F, the through silicon via die 120, the bridge die 110, the first encapsulant 130, and the redistribution circuit structure 170 are placed on a second carrier board 20, and the first carrier board 10 is removed.

In an embodiment, the second carrier board 20 may be first configured on the first carrier board 10 and components (for example: the structures shown in FIG. 1D) located on the first carrier board 10, so that the components (for example: the through silicon via die 120, the bridge die 110, the first encapsulant 130, and the redistribution circuit structure 170) on the first carrier board 10 are clamped between the second carrier board 20 and the first carrier board 10. Then, the first carrier board 10, the second carrier board 20, and the components clamped between the second carrier board 20 and the first carrier board 10 flip upside down. Then, the first carrier board 10 is removed. It should be noted that, the above manner is merely an exemplary example, and is not limited in the invention.

In the present embodiment, the second carrier board 20 may include a release layer 21. The release layer 21 may be an LTHC adhesive layer, but the invention is not limited thereto.

In the present embodiment, after the first carrier board 10 is removed, the connection pad 127 of the through silicon via die 120 and the interconnection structure 116 of the bridge die 110 may be exposed.

Referring to FIG. 1F, after the first carrier board 10 is removed, a first active die 140 or a second active die 150 are configured. The first active die 140 or the second active die 150 is electrically connected to the bridge die 110, and the first active die 140 is electrically connected to the through silicon via die 120. It should be noted that, the invention does not limit the quantity and sequence of the configured first active dies 140 or second active dies 150.

In the present embodiment, after the above first thinning process, the bridge die 110 and the through silicon via die 120 are substantially the same in thickness. Moreover, the bridge die 110 and the through silicon via die 120 may include a hard substrate (for example: the bridge die 110 includes a silicon substrate 115, and the through silicon via die 120 includes a silicon substrate 125). In addition, the bridge die 110 and the through silicon via die 120 are at least laterally covered and fixed by the first encapsulant 130. In this way, when the first active die 140 or the second active die 150 is configured on the bridge die 110 or the through silicon via die 120, a lateral shift can be reduced or a joint force in a vertical direction can be improved, and the manufacturing yield or quality of the packaging structure 100 can be improved. In an embodiment, the first encapsulant 130 may completely cover a bridge side surface 113 of the bridge die 110 and a connection side surface 123 of the through silicon via die 120.

In an embodiment, the first active die 140 or the second active die 150 may be a power management integrated circuit (PMIC), a micro-electro-mechanical-system (MEMS), an application-specific integrated circuit (ASIC), a dynamic random access memory (DRAM), a static random access memory (SRAM), a high bandwidth memory (HBM) chip, a system on chip (SoC), or another similar high performance computing (HPC) chip, but the invention is not limited thereto.

In an embodiment, the first active die 140 and the second active die 150 may be homogeneous dies or may be heterogeneous dies, which is not limited in the invention.

In the present embodiment, after the first carrier board 10 is removed, a passive device 191 may be further configured. The passive device 191 may be electrically connected to the through silicon via die 120. It should be noted that, the invention does not limit the quantity or sequence of the configured first active dies 140, second active dies 150, or passive devices 191. In an embodiment, the passive device 191 is, for example, a multi-layer ceramic capacitor (MLCC), but the invention is not limited thereto.

Figure 1G:
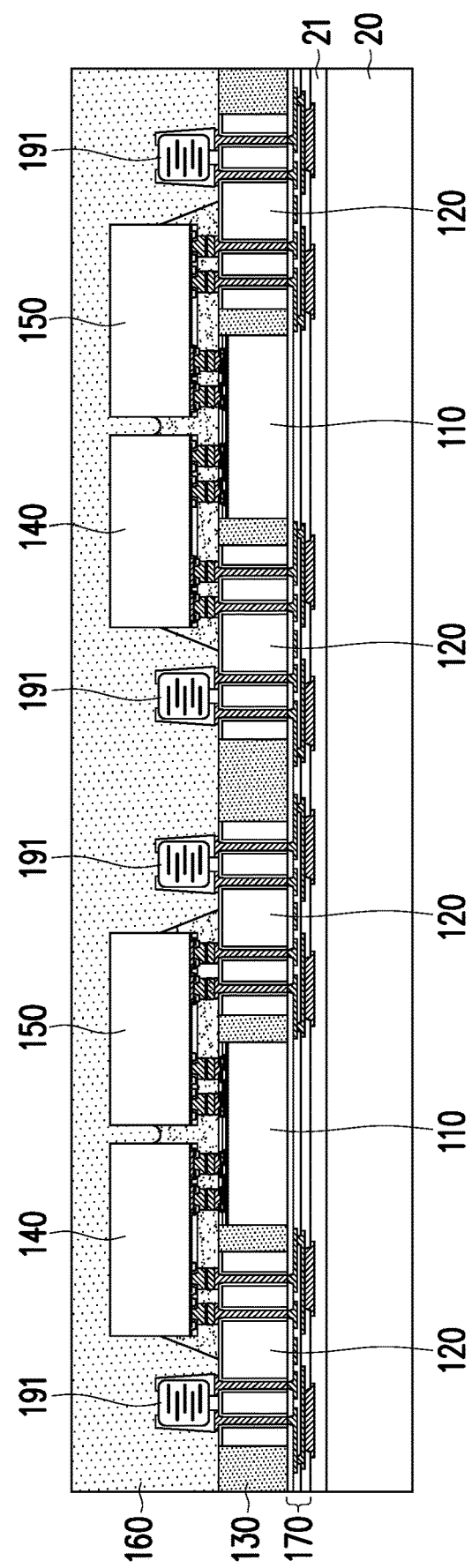

Referring to FIG. 1G, a second encapsulant 160 covering the first active die 140 and the second active die 150 is formed. The material or forming manner of the second encapsulant 160 is same as or similar to that of the first encapsulant 130, and therefore is not described herein again.

In the present embodiment, the first active die 140 and the second active die 150 are not exposed outside the second encapsulant 160, but the invention is not limited thereto.

In the present embodiment, the second encapsulant 160 may further cover the passive device 191, and the passive device 191 is not exposed outside the second encapsulant 160, but the invention is not limited thereto.

Figure 1H:
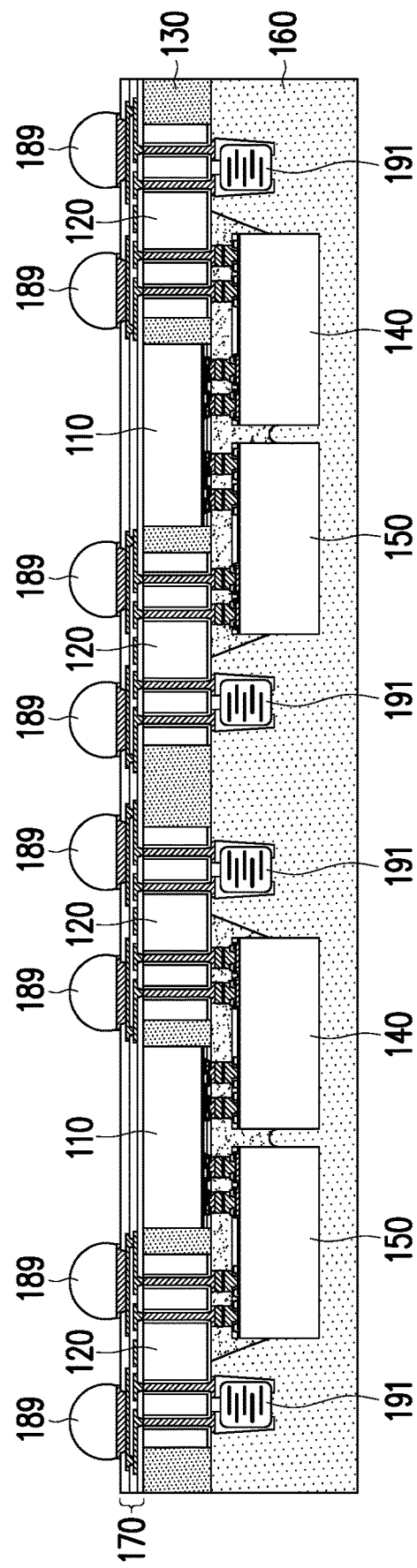
Figure 1I:
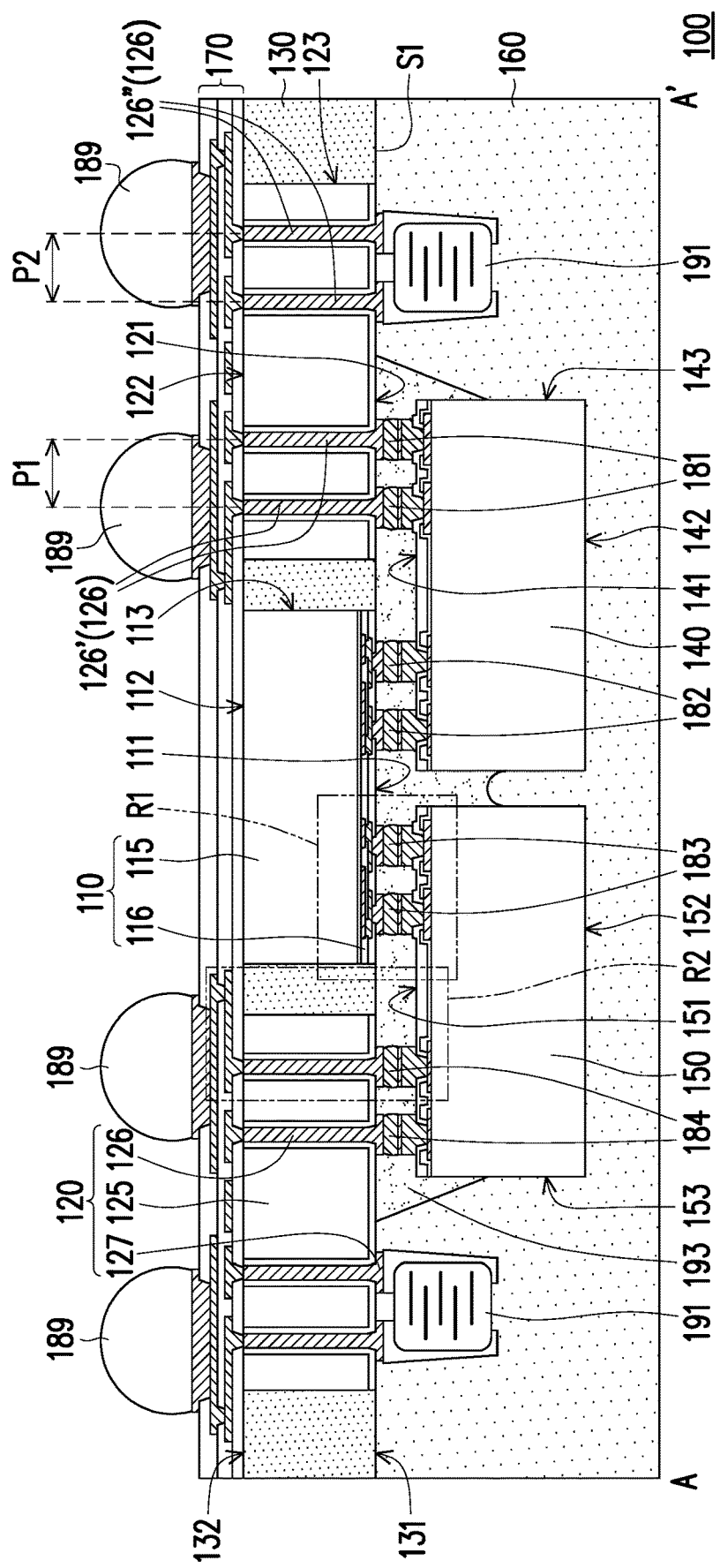
FIG. 1I is a partial schematic sectional view of a packaging structure according to the first embodiment of the invention.
Figure 1J:
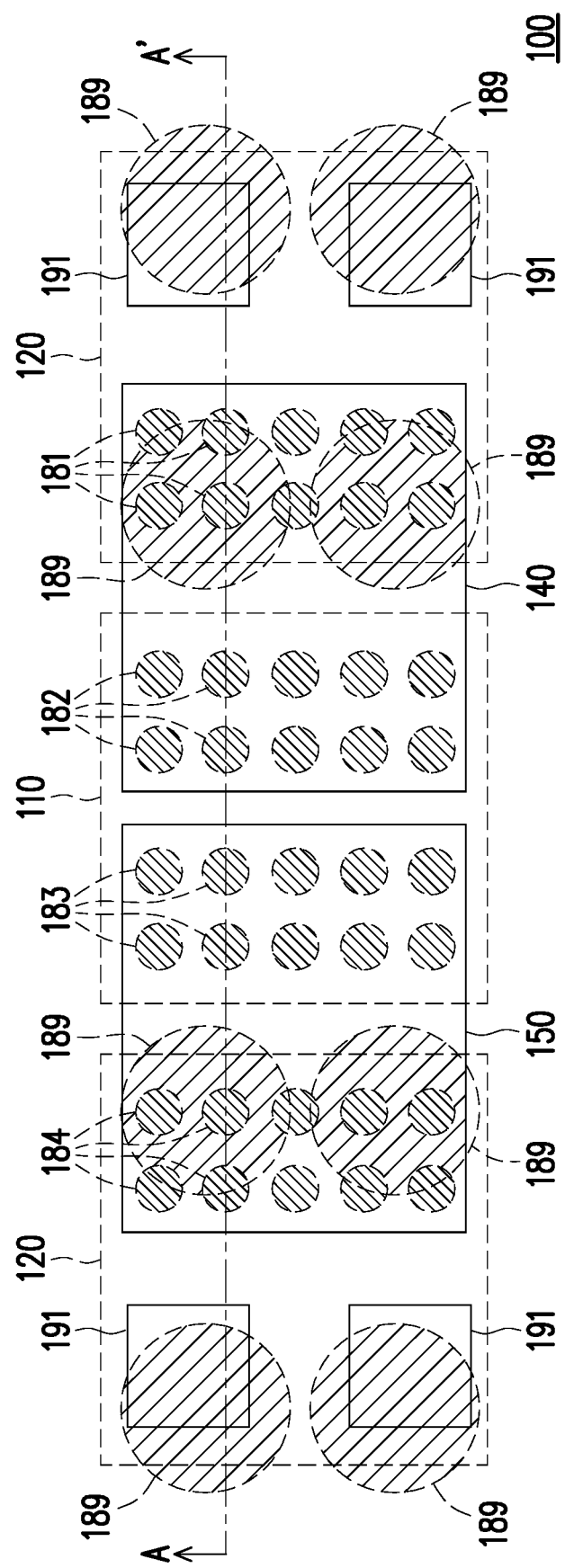
FIG. 1J is a partial schematic bottom view of a packaging structure according to the first embodiment of the invention.
Figure 1K:
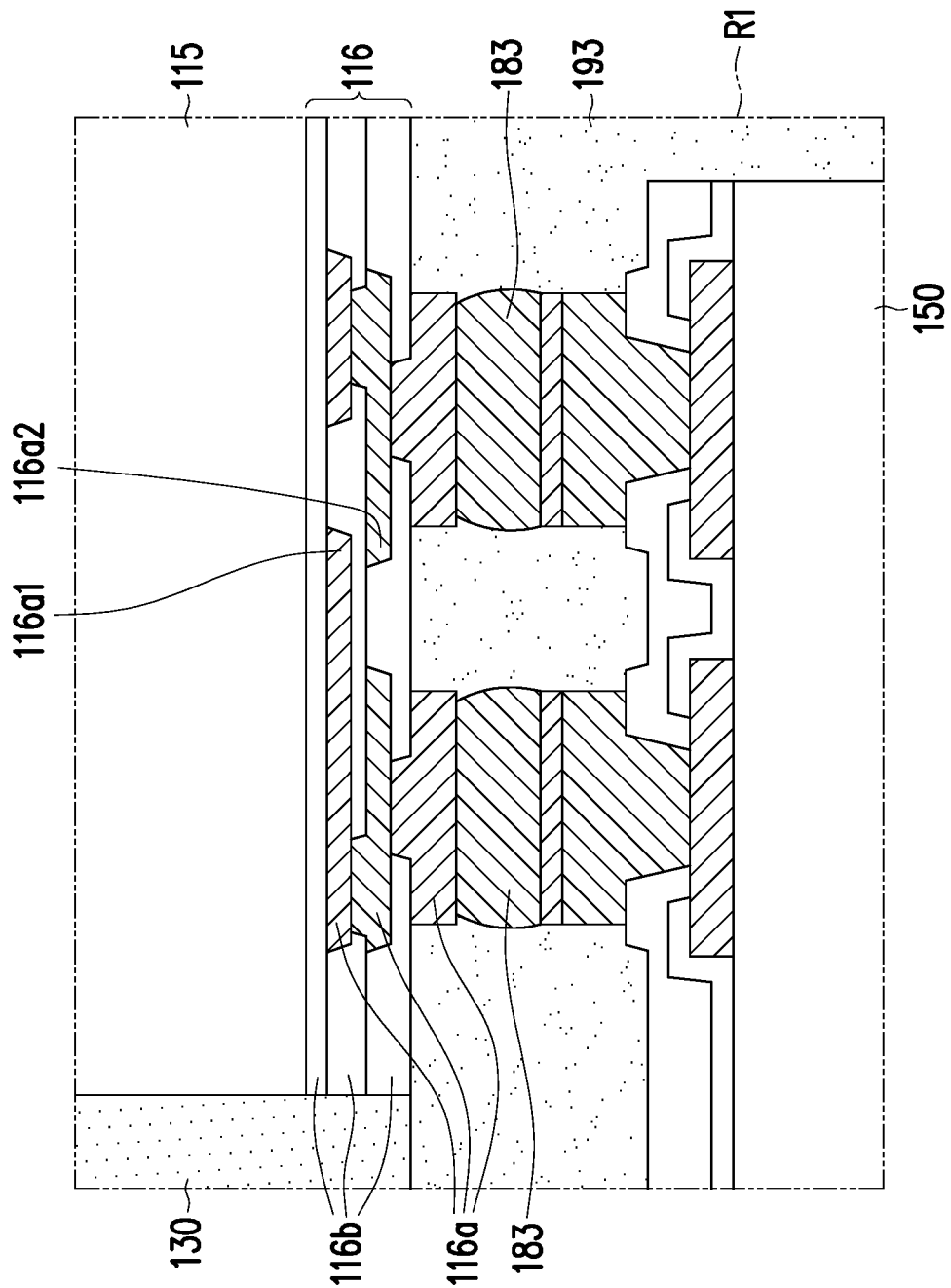
FIG. 1K to FIG. 1L are partial schematic sectional enlarged views of a packaging structure according to the first embodiment of the invention.
Figure 1L:
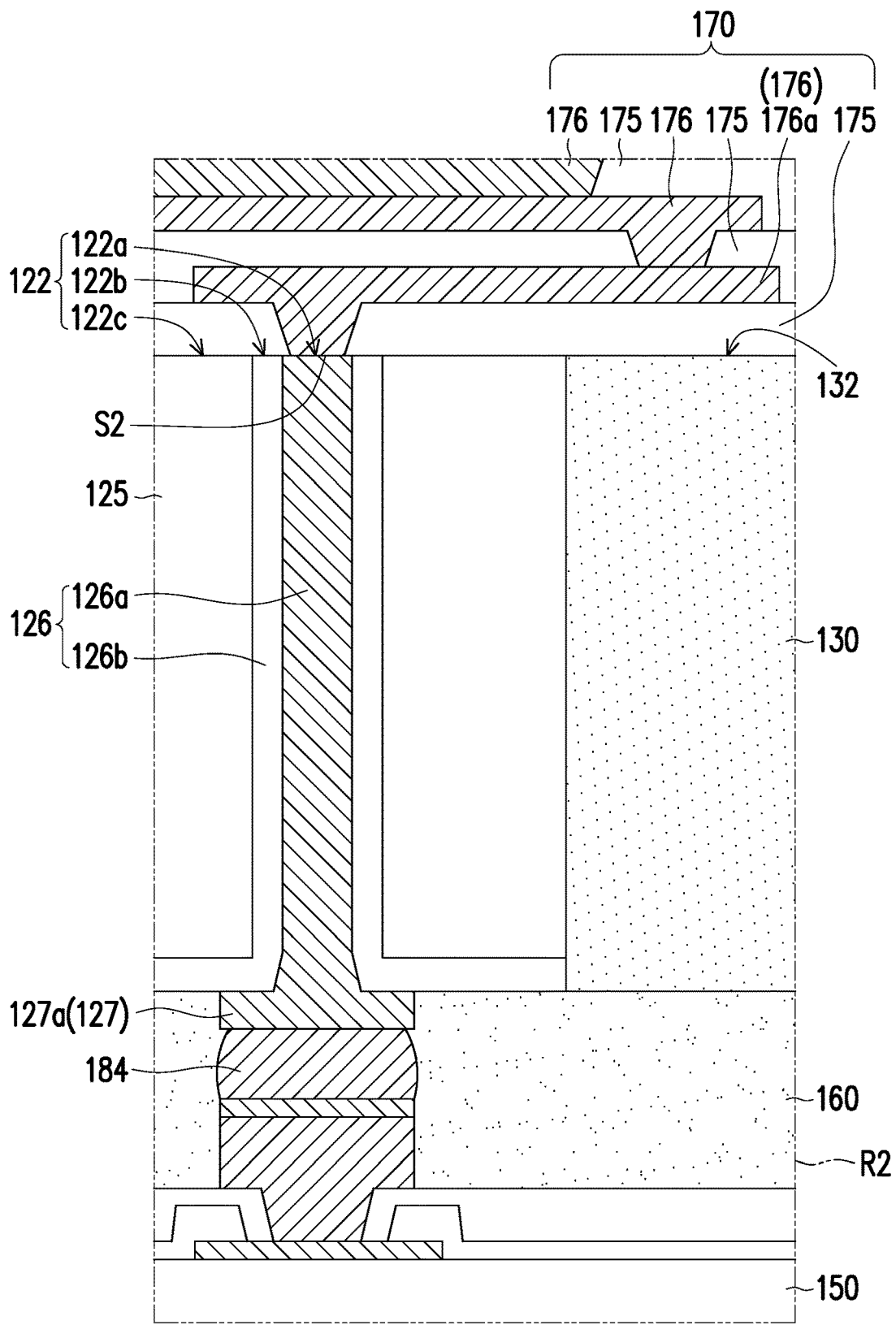

Referring to FIG. 1G to FIG. 1H, after the second encapsulant 160 is formed, the second carrier board 20 may be removed. Moreover, after the second carrier board 20 is removed, a plurality of conductive terminals 189 are formed. The conductive terminal 189 may be electrically connected to the redistribution circuit structure 170.

The conductive terminal 189 may be a conductive pillar, a solder ball, a conductive bump, or a conductive terminal 189 in other forms or shapes. The conductive terminal 189 may be formed through electroplating, deposition, ball placement, reflow, and/or other suitable processes.

Referring to FIG. 1H to FIG. 1I, in the present embodiment, a plurality of packaging structures 100 may be constructed by using a singulation process. The singulation process may include, for example, a dicing process/cutting process, to cut through the first encapsulant 130, the second encapsulant 160, and/or the redistribution circuit structure 170.

It should be noted that, after the singulation process is performed, similar component symbols are used for singulated elements. For example, the bridge die 110 (as shown in FIG. 1H) after singulation may be the bridge die 110 (as shown in FIG. 1I), the through silicon via die 120 (as shown in FIG. 1H) after singulation may be the through silicon via die 120 (as shown in FIG. 1I), the first encapsulant 130 (as shown in FIG. 1H) after singulation may be the first encapsulant 130 (as shown in FIG. 1I), the first active die 140 (as shown in FIG. 1H) after singulation may be the first active die 140 (as shown in FIG. 1I), the second active die 150 (as shown in FIG. 1H) after singulation may be the second active die 150 (as shown in FIG. 1I), the second encapsulant 160 (as shown in FIG. 1H) after singulation may be the second encapsulant 160 (as shown in FIG. 1I), and the redistribution circuit structure 170 (as shown in FIG. 1H) after singulation may be the redistribution circuit structure 170 (as shown in FIG. 1I), and so on. Other singulated elements follow the above same element symbol rule, which is not described again or particularly shown herein.

It should be noted that, the invention does not limit the sequence of configuring the plurality of conductive terminals 189 (if exist) and the singulation processes (if exist).

After the above steps, the manufacture of the packaging structure 100 of the present embodiment may be roughly completed.

Referring to FIG. 1I to FIG. 1L, the packaging structure 100 includes a bridge die 110, a through silicon via die 120, a first encapsulant 130, a first active die 140, a second active die 150, a second encapsulant 160, and a redistribution circuit structure 170. The first encapsulant 130 covers a plurality of through silicon via dies 120 and bridge dies 110. The first active die 140 is electrically connected to the bridge die 110 and the through silicon via die 120. The second active die 150 is electrically connected to the bridge die 110. The second encapsulant 160 covers the first active die 140 and the second active die 150. The redistribution circuit structure 170 is electrically connected to the through silicon via die 120, where the through silicon via die 120 is disposed between the first active die 140 and the redistribution circuit structure 170.

In the present embodiment, a sidewall of the first encapsulant 130, a sidewall of the second encapsulant 160, and a sidewall of the redistribution circuit structure 170 may be substantially aligned.

In the present embodiment, the bridge die 110 includes a bridge connection surface 111, a bridge back surface 112, and a bridge side surface 113. The bridge back surface 112 is opposite to the bridge connection surface 111. The bridge side surface 113 is connected to the bridge connection surface 111 and the bridge back surface 112. The bridge die 110 includes a silicon substrate 115 and an interconnection structure 116. The interconnection structure 116 is located on the silicon substrate 115.

In the present embodiment, the interconnection structure 116 is, for example, a multilayer interconnection structure. For example, the interconnection structure 116 includes a plurality of conductive layers 116a and a plurality of insulating layers 116b, and a part of the conductive layer 116a1 and a part of the conductive layer 116a2 may interlace/intercross. In this way, the layout utilization of the interconnection structure 116 can be improved, and to a plurality of dies or a plurality of connection points of a plurality of dies may be connected by using the interconnection structure 116 in the bridge die 110.

In an embodiment, a partial surface of the interconnection structure 116 far away from silicon substrate 115 (for example: a surface of the interconnection structure 116 farthest away from the silicon substrate 115) may construct the bridge connection surface 111, but the invention is not limited thereto.

In an embodiment, a partial surface of the silicon substrate 115 far away from the interconnection structure 116 (for example: a surface of the silicon substrate 115 farthest away from the interconnection structure 116) may construct the bridge back surface 112, but the invention is not limited thereto.

In the present embodiment, the through silicon via die 120 includes a first connection surface 121, a second connection surface 122, and a connection side surface 123. The second connection surface 122 is opposite to the first connection surface 121. The connection side surface 123 is connected to the first connection surface 121 and the second connection surface 122. The through silicon via die 120 may include a silicon substrate 125, a through silicon conductor 126, and a connection pad 127. The through silicon conductor 126 penetrates the silicon substrate 125. The connection pad 127 is located on the silicon substrate 125.

In the present embodiment, the through silicon conductor 126 includes a conductive core layer 126a and an insulating shell layer 126b laterally coating the conductive core layer 126a. A partial surface of the silicon substrate 125 (for example: a surface of the silicon substrate 125 farthest away from the connection pad 127), a partial surface of the conductive core layer 126a, and a partial surface of the insulating shell layer 126b are substantially coplanar and construct the second connection surface 122.

Compared with a through molding via (TMV), the conductive structure of a through silicon via (TSV) may have better conductivity after the manufacturing process of the package structure. For example, compared with epoxy resin or other similar resin materials, the silicon substrate can have lesser deformation during a heating process or a cooling process. As such, the possibility of damage or breakage of the conductive structure penetrating the silicon substrate may be reduced.

In an embodiment, a partial surface of the silicon substrate 125 (for example: a partial surface of the silicon substrate 125 that includes a connection pad 127 thereon) or a partial surface of the connection pad 127 may construct the first connection surface 121, but the invention is not limited thereto.

In the present embodiment, the connection pad 127 may include a conductive connection layer 127a. The conductive core layer 126a and the conductive connection layer 127a may be same films.

In the present embodiment, the first active die 140 includes a first active surface 141, a first back surface 142, and a first side surface 143. The first back surface 142 is opposite to the first active surface 141. The first side surface 143 is connected to the first active surface 141 and the first back surface 142. The first active surface 141 of the first active die 140 faces the first connection surface 121 of the through silicon via die 120, and the first active surface 141 and the first connection surface 121 are partially overlapped. The first active surface 141 of the first active die 140 facing the bridge connection surface 111 of the bridge die 110, and the first active surface 141 and the bridge connection surface 111 are partially overlapped.

In the present embodiment, a first conductive connector 181 may be included between the first active surface 141 of the first active die 140 and the first connection surface 121 of the through silicon via die 120. The first active die 140 and the through silicon via die 120 may be electrically connected to each other by using the first conductive connector 181.

In the present embodiment, a second conductive connector 182 may be included between the first active surface 141 of the first active die 140 and the bridge connection surface 111 of the bridge die 110. The first active die 140 and the bridge die 110 may be electrically connected to each other by using the second conductive connector 182.

In the present embodiment, the second active die 150 includes a second active surface 151, a second back surface 152, and a second side surface 153. The second back surface 152 is opposite to the second active surface 151. The second side surface 153 is connected to the second active surface 151 and the second back surface 152. The second active surface 151 of the second active die 150 faces the bridge connection surface 111 of the bridge die 110, and the second active surface 151 and the bridge connection surface 111 are partially overlapped.

In the present embodiment, a third conductive connector 183 may be included between the second active surface 151 of the second active die 150 and the bridge connection surface 111 of the bridge die 110. The second active die 150 and the bridge die 110 may be electrically connected to each other by using the third conductive connector 183.

In the present embodiment, the second active die 150 may be electrically connected to another through silicon via die 120, but the invention is not limited thereto. For example, a fourth conductive connector 184 may be included between the second active surface 151 of the second active die 150 and the first connection surface 121 of the another through silicon via die 120. The second active die 150 and the another the through silicon via die 120 may be electrically connected to each other by using the fourth conductive connector 184.

In an embodiment, the first conductive connector 181, the second conductive connector 182, the third conductive connector 183, or the fourth conductive connector 184 may be a solder ball or a conductive connector in other forms or shapes, which is not limited in the invention.

In the present embodiment, the first encapsulant 130 may cover the connection side surface 123 of the through silicon via die 120 and the bridge side surface 113 of the bridge die 110. The first encapsulant 130 includes a first encapsulation surface 131 and a second encapsulation surface 132. The second encapsulation surface 132 is opposite to the first encapsulation surface 131.

In the present embodiment, the second connection surface 122 of the through silicon via die 120, the bridge back surface 112 of the bridge die 110, and the second encapsulation surface 132 of the first encapsulant 130 are substantially coplanar.

In an embodiment, the first encapsulant 130 may be a homogeneous material, and the above homogeneous material cannot split elements into different single materials by using a mechanical method (for example: manners such as breaking, shearing, cutting, sawing, and grinding). In other words, the first encapsulant 130 may not include an interface formed due to a different material or a different process.

In the present embodiment, the second encapsulant 160 may cover the first side surface 143 or the first back surface 142 of the first active die 140, and the second encapsulant 160 may cover the second side surface 153 or the second back surface 152 of the second active die 150.

In an embodiment, the second encapsulant 160 may be a homogeneous material. In other words, the second encapsulant 160 may not include an interface formed due to a different material or a different process.

In the present embodiment, the first encapsulation surface 131 of the first encapsulant 130 faces the second encapsulant 160, and the first encapsulation surface 131 of the first encapsulant 130, and the second encapsulant 160 physically contact.

In an embodiment, the first encapsulant 130 and the second encapsulant 160 are formed in different steps. Therefore, an interface S1 may be included between the first encapsulant 130 and the second encapsulant 160.

In the present embodiment, the redistribution circuit structure 170 is at least located on the second connection surface 122 of the through silicon via die 120. For example, the redistribution circuit structure 170 may be located on the second connection surface 122 of the through silicon via die 120, the bridge back surface 112 of the bridge die 110, and the second encapsulation surface 132 of the first encapsulant 130. The redistribution circuit structure 170 may include a patterned dielectric layer 175 and a patterned conductive layer 176, and a part of the patterned dielectric layer 175 may penetrate the patterned conductive layer 176.

In the present embodiment, a patterned conductive layer 176a (namely, one of the plurality of patterned conductive layers 176) closest to the through silicon via die 120 may contact the conductive core layer 126a of the through silicon conductor 126 of the through silicon via die 120. In an embodiment, the above patterned conductive layer 176a and the conductive core layer 126a are formed in different steps. Therefore, an interface S2 may be included between the above patterned conductive layer 176 and the conductive core layer 126a.

In the present embodiment, the packaging structure 100 may further include a passive device 191, and the second encapsulant 160 may further cover the passive device 191. The passive device 191 may be electrically connected to the corresponding through silicon conductor 126 in the through silicon via die 120. For example, the through silicon conductor 126 of the through silicon via die 120 may include a plurality of first through silicon conductors 126' and a plurality of second through silicon conductor 126". The first through silicon conductor 126' may be overlapped with and electrically connected to the first active die 140 or the second active die 150. The second through silicon conductor 126" may be overlapped with and electrically connected to the passive device 191.

In the present embodiment, a first spacing P1 exists between a plurality of first through silicon conductors 126', a second spacing P2 exists between a plurality of second through silicon conductors 126", and the second spacing P2 is greater than or equal to the first spacing P1.

In the present embodiment, the packaging structure 100 may further include a filling layer 193. The filling layer 193 may be located between the first active die 140 and the through silicon via die 120, between the first active die 140 and the bridge die 110, and between the second active die 150 and the bridge die 110. The filling layer 193 is, for example, a capillary underfill (CUF) or other suitable filling materials, which is not limited in the invention.

In the present embodiment, in the packaging structure 100, at least two active dies (for example: the first active die 140 or the second active die 150) may be electrically connected by using the interconnection structure 116 of the bridge die 110. Moreover, the interconnection structure 116 may be formed by using a BEOL process in general semiconductor manufacture. Therefore, compared with a general common circuit board, a pitch between lines or electrical connection points in the interconnection structure 116 of the bridge die 110 may correspond to the connected active dies (for example: the first active die 140 or the second active die 150), and the lines or electrical connection points in the interconnection structure 116 of the bridge die 110 have a better fine pitch.

In the present embodiment, the active die (for example: the first active die 140 or the second active die 150) of the packaging structure 100 may be electrically connected to an external electronic device by using the through silicon via die 120. Moreover, the through silicon conductor 126 in the through silicon via die 120 is substantially a vertical conductive path. Therefore, by using the through silicon conductor 126 in the through silicon via die 120, a transmission path or time of an electronic signal can be reduced, and the transmission quality of the electronic signal can be improved.

Generally, the value or price of the active die (for example: the first active die 140 or the second active die 150) is higher than a die including no active device (for example: the bridge die 110 or the through silicon via die 120). Therefore, in the present embodiment, the manufacturing method of the packaging structure 100 is: first encapsulating a known good bridge die 110 and a known good through silicon via die 120 by using the first encapsulant 130, and then an active die (for example: the first active die 140 or the second active die 150) configuring electrically connected to the bridge die 110 or the through silicon via die 120. In this way, the manufacturing yield of the packaging structure 100 can be improved, or the manufacturing costs of the packaging structure 100 can be reduced.

Figure 2A:
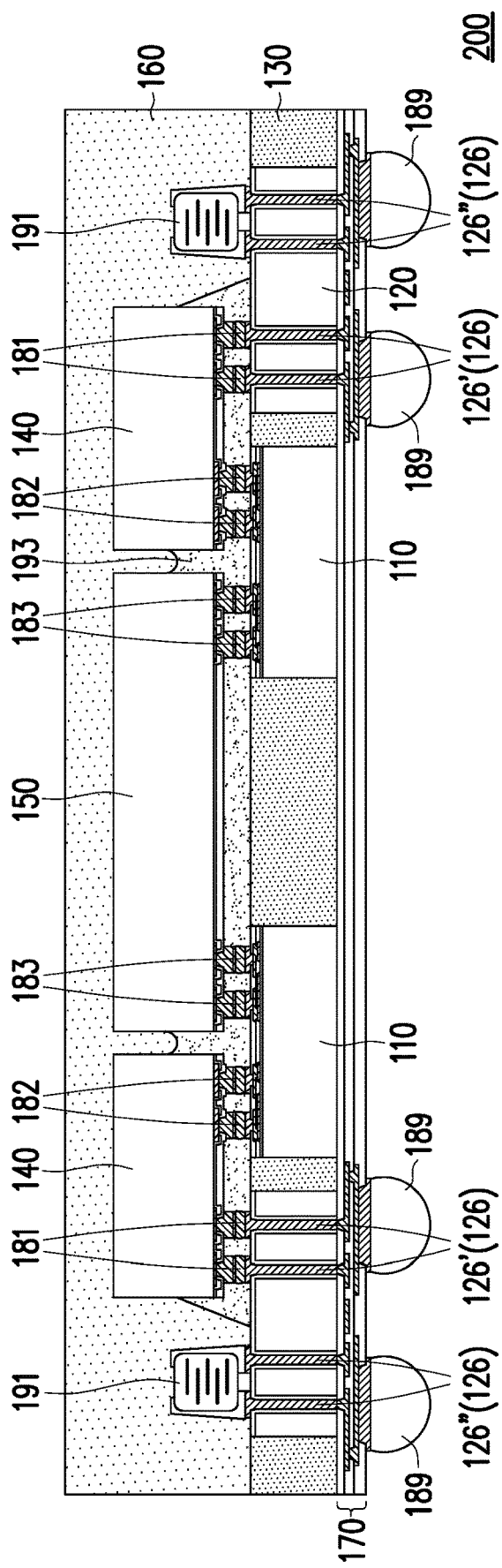
FIG. 2A is a partial schematic sectional view of a packaging structure according to a second embodiment of the invention.
Figure 2B:
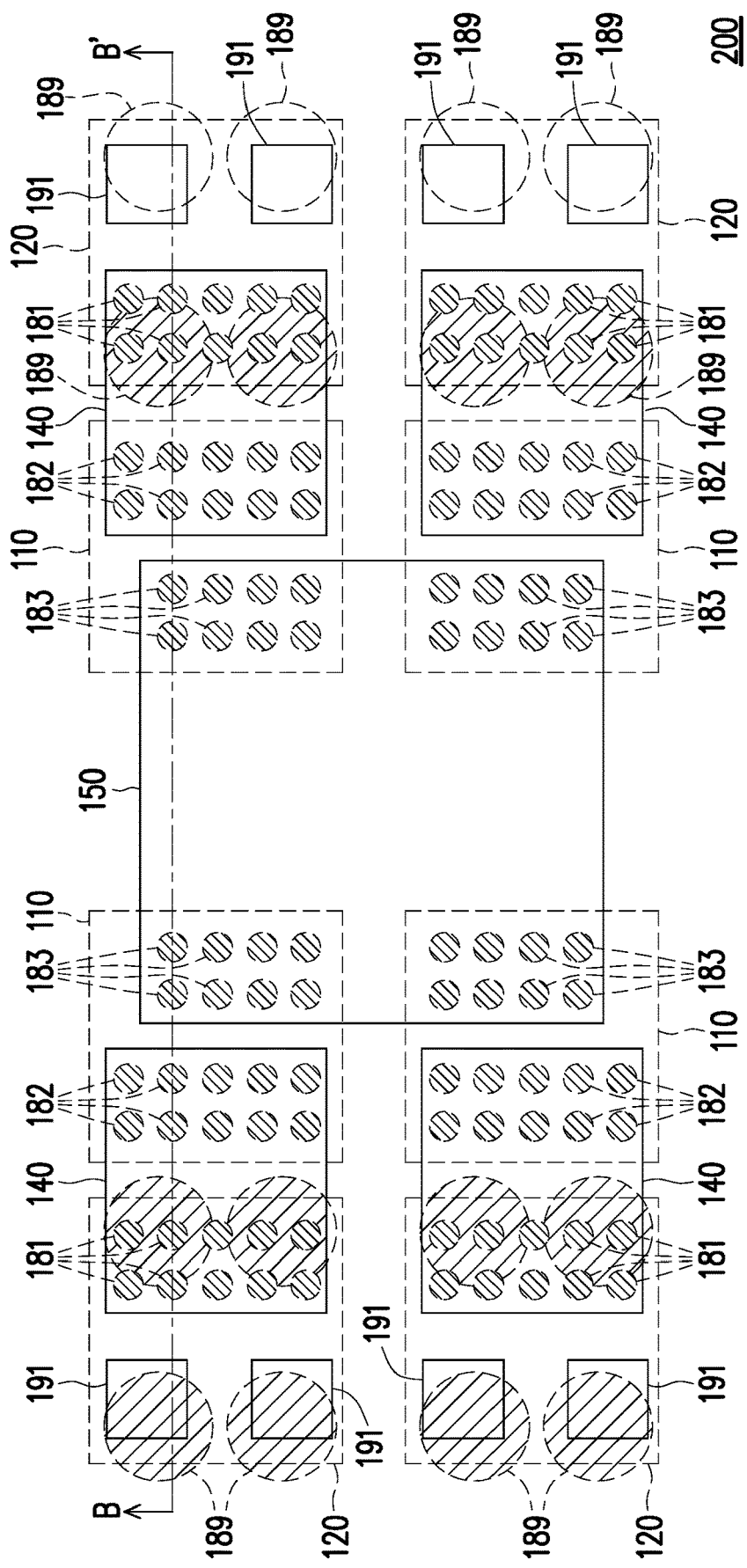
FIG. 2B is a partial schematic bottom view of a packaging structure according to the second embodiment of the invention.

FIG. 2A is a partial schematic sectional view of a packaging structure according to a second embodiment of the invention. FIG. 2B is a partial schematic bottom view of a packaging structure according to the second embodiment of the invention. FIG. 2A is, for example, a schematic sectional view corresponding to line B-B' in FIG. 2B.

In the present embodiment, the manufacturing method of the packaging structure 200 is similar to the manufacturing method of the packaging structure 100. Similar components thereof are represented by using same numbers, and include similar functions, materials, or forming manners. The description is omitted.

Referring to FIG. 2A and FIG. 2B, in the present embodiment, the packaging structure 200 includes a plurality of bridge dies 110, a plurality of through silicon via dies 120, a first encapsulant 130, a plurality of first active dies 140, a second active die 150, a second encapsulant 160, and a redistribution circuit structure 170.

In the present embodiment, the first active die 140 and the second active die 150 may be heterogeneous dies, and a plurality of first active die 140 may be homogeneous dies. For example, the first active die 140 may be an HBM chip, and the second active die 150 may be an SoC.

Figure 3:
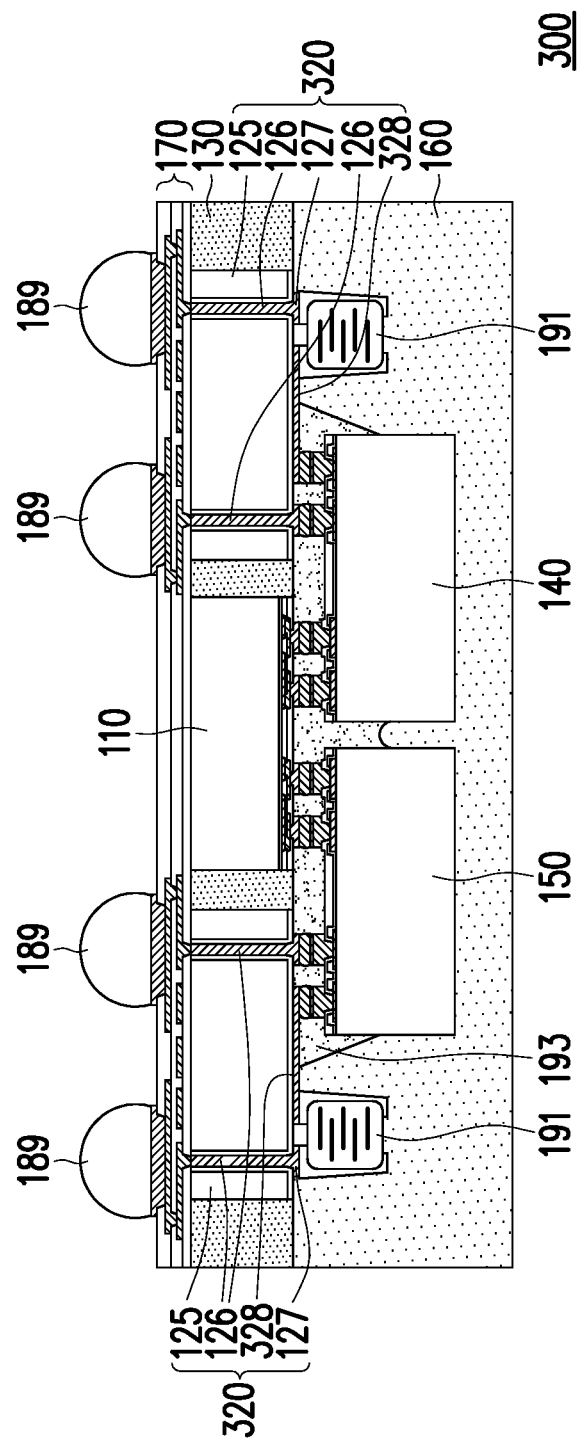
FIG. 3 is a partial schematic sectional view of a packaging structure according to a third embodiment of the invention.

FIG. 3 is a partial schematic sectional view of a packaging structure according to a third embodiment of the invention.

In the present embodiment, the manufacturing method of the packaging structure 300 is similar to the manufacturing method of the packaging structure 100. Similar components thereof are represented by using same numbers, and include similar functions, materials, or forming manners. The description is omitted.

In the present embodiment, the packaging structure 300 includes a bridge die 110, a through silicon via die 320, a first encapsulant 130, a first active die 140, a second active die 150, a second encapsulant 160, and a redistribution circuit structure 170. The second encapsulant 160 covers the first active die 140 and the second active die 150. The first encapsulant 130 covers a plurality of through silicon via dies 320 and bridge dies 110. The first active die 140 is electrically connected to the bridge die 110 and the through silicon via die 320. The redistribution circuit structure 170 is electrically connected to the through silicon via die 320, where the through silicon via die 320 is located between the first active die 140 and the redistribution circuit structure 170.

In the present embodiment, the through silicon via die 320 may include a silicon substrate 125, a through silicon conductor 126, a connection pad 127, and a connection line 328. The connection line 328 is located on the silicon substrate 125.

In the present embodiment, the connection pad 127 and the connection line 328 may be formed by using the same or similar steps. That is, the structure, material, or thickness of the connection pad 127 may be same as or similar to the structure, material, or thickness of the connection line 328. For example, the structure, material, or thickness of the connection pad 127 is substantially same as the structure, material, or thickness of the connection line 328.

In the present embodiment, the connection line 328 may be physically isolated from the through silicon conductor 126, but the invention is not limited thereto.

In the present embodiment, the packaging structure 300 may further include a passive device 191. The passive device 191 may be electrically connected to the first active die 140 or the second active die 150 by using the connection line 328.

Figure 4:
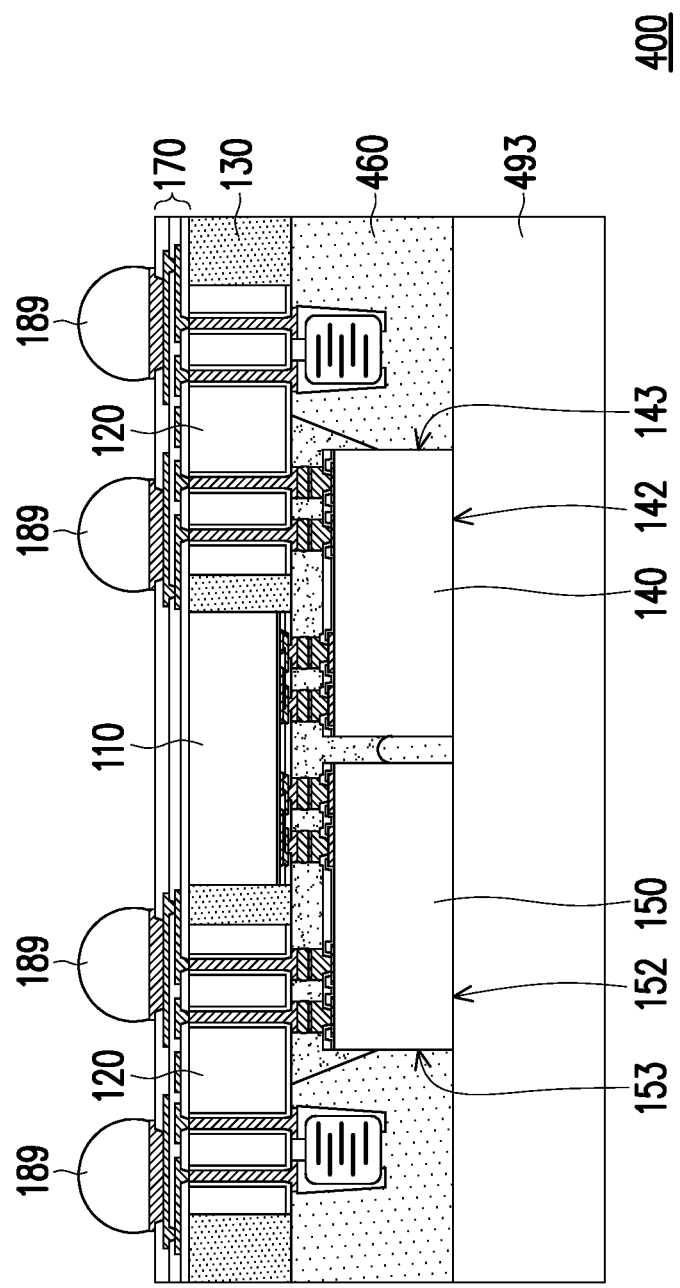
FIG. 4 is a partial schematic sectional view of a packaging structure according to a fourth embodiment of the invention.

FIG. 4 is a partial schematic sectional view of a packaging structure according to the fourth embodiment of the invention.

In the present embodiment, the manufacturing method of the packaging structure 400 is similar to the manufacturing method of the packaging structure 100. Similar components thereof are represented by using same numbers, and include similar functions, materials, or forming manners. The description is omitted.

In the present embodiment, the packaging structure 400 includes a bridge die 110, a through silicon via die 120, a first encapsulant 130, a first active die 140, a second active die 150, a second encapsulant 460, and a redistribution circuit structure 170. The second encapsulant 460 covers the first active die 140 and the second active die 150.

In the present embodiment, the second encapsulant 460 may cover a first side surface 143 of the first active die 140 and a second side surface 153 of the second active die 150, and the second encapsulant 460 may expose a first back surface 142 of the first active die 140 and a second back surface 152 of the second active die 150.

In the present embodiment, the packaging structure 400 may further include a heat dissipation member 493. The heat dissipation member 493 is at least thermally coupled to the first active die 140 or the second active die 150.

For example, referring to FIG. 1G and FIG. 4, after the first active die 140 and the second active die 150 are configured, a second encapsulation material covering the first active die 140 and the second active die 150 may be formed (for example: similar to the step in FIG. 1G). The material or forming manner of the second encapsulation material is same as or similar to the first encapsulation material 139 (marked in FIG. 1B), and therefore is not described herein again. Then, after the above second encapsulation material is formed, a second thinning process may be performed, to form a second encapsulant 460 laterally covering the first active die 140 and the second active die 150, and expose the first active die 140 and the second active die 150. The second thinning process is same as or similar to the above first thinning process, and therefore is not described herein again.

In the present embodiment, the heat dissipation member 493 may contact the first back surface 142 of the first active die 140 and the second back surface 152 of the second active die 150, so that the heat dissipation member 493 may be thermally coupled to the first active die 140 or the second active die 150.

In an embodiment that is not shown, a thermal interface material (TIM) may be included between the heat dissipation member 493 and the first back surface 142 of the first active die 140 or the second back surface 152 of the second active die 150, so that the heat dissipation member 493 may be thermally coupled to the first active die 140 or the second active die 150.

Based on the above, the packaging structure of the invention may integrate a plurality of active dies. The plurality of active dies may be electrically connected to each other by using the bridge die, and the active dies may be electrically connected to the redistribution circuit structure by using the through silicon via die. In this way, the quality of the packaging structure can be improved. Moreover, in the manufacturing method of the packaging structure, the bridge die and the through silicon via die may be first coated by using the first encapsulant, and then an active die electrically connected to the bridge die or the through silicon via die may be configured. In this way, the manufacturing yield of the packaging structure can be improved, or the manufacturing costs of the packaging structure can be reduced.

What is claimed is:

1. A packaging structure, comprising:
   a bridge die;
   a through silicon via die, comprising a first the through silicon via die, wherein the first the through silicon via die comprises a plurality of first through silicon conductors and a plurality of second through silicon conductors;
   a first encapsulant, covering the through silicon via die and the bridge die;
   a first active die, electrically connected to the bridge die and the through silicon via die;
   a second active die, electrically connected to the bridge die;
   a passive device, electrically connected to the first the through silicon via die;
   a second encapsulant, covering the first active di; the second active die and the passive device; and
   a redistribution circuit structure, electrically connected to the through silicon via die, wherein:
   the through silicon via die is disposed between the first active die and the redistribution circuit structure;
   the plurality of first through silicon conductors are overlapped on the first active die, and a first spacing exists between the plurality of first through silicon conductors;
   the plurality of second through silicon conductors are overlapped on the passive device, and a second spacing exists between the plurality of second through silicon conductors; and
   the second spacing is greater than or equal to the first spacing.

2. The packaging structure according to claim 1, wherein:
   the first active die comprises a first active surface;
   the second active die comprises a second active surface;
   the through silicon via die comprises a first connection surface and a second connection surface opposite to the first connection surface;
   the bridge die comprises a bridge connection surface and a bridge back surface opposite to the bridge connection surface;
   the bridge connection surface faces the first active surface and the second active surface;
   the first connection surface faces the first active surface; and
   the redistribution circuit structure is at least disposed on the second connection surface.

3. The packaging structure according to claim 2, wherein:
   the first encapsulant comprises a first encapsulation surface and a second encapsulation surface opposite to the first encapsulation surface;
   the first encapsulation surface faces the second encapsulant; and
   the second connection surface, the bridge back surface, and the second encapsulation surface are substantially coplanar.

4. The packaging structure according to claim 3, wherein the through silicon via die comprises:
   a silicon substrate; and
   a through silicon conductor, penetrating the silicon substrate, and comprising a conductive core layer and an insulating shell layer laterally coating the conductive core layer, wherein a partial surface of the silicon substrate, a partial surface of the conductive core layer, and a partial surface of the insulating shell layer are substantially coplanar and construct at least one part of the second connection surface.

5. The packaging structure according to claim 2, wherein the through silicon via die comprises:
   a silicon substrate;
   a through silicon conductor, penetrating the silicon substrate, and comprising a conductive core layer and an insulating shell layer laterally coating the conductive core layer; and;
   a connection pad, disposed on the silicon substrate and comprising a conductive connection layer, wherein the conductive core layer and the conductive connection layer are same films.

6. The packaging structure according to claim 1, wherein the bridge die comprises:
   a silicon substrate; and
   an interconnection structure, disposed on the silicon substrate, and comprising a plurality of conductive layers and an insulating layer clamped between the plurality of conductive layers.

7. The packaging structure according to claim 1, wherein the bridge die is disposed between the second active die and the redistribution circuit structure.

8. The packaging structure according to claim 1, wherein the first encapsulant and the second encapsulant physically contact.

9. The packaging structure according to claim 1, further comprising:
a heat dissipation member, at least thermally coupled to the first active die or the second active die.

10. A manufacturing method of a packaging structure, comprising:
providing a through silicon via die and a bridge die, wherein the through silicon via die comprises a first the through silicon via die, and the first the through silicon via die comprises a plurality of first through silicon conductors and a plurality of second through silicon conductors;
forming a first encapsulant covering the through silicon via die and the bridge die;
forming a redistribution circuit structure electrically connected to the through silicon via die;
configuring a first active die electrically connected to the bridge die and the through silicon via die;
configuring a second active die electrically connected to the bridge die;
configuring a passive device electrically connected to the first the through silicon via die; and
forming a second encapsulant covering the first active die, the second active die, and the passive device, wherein after the step of forming the redistribution circuit structure and the step of configuring the first active die, the through silicon via die is disposed between the first active die and the redistribution circuit structure,
wherein after the step of configuring the first active die and the step of configuring a passive device electrically connected to the first the through silicon via die, the plurality of first through silicon conductors are overlapped on the first active die and the plurality of second through silicon conductors are overlapped on the passive device, wherein a first spacing exists between the plurality of first through silicon conductors, a second spacing exists between the plurality of second through silicon conductors and the second spacing is greater than or equal to the first spacing.

11. The manufacturing method of the packaging structure according to claim 10, wherein:
the step of providing the through silicon via die and the bridge die comprises configuring the through silicon via die and the bridge die on a first carrier board; and
the step of forming the first encapsulant comprises forming the first encapsulant on the carrier board, and
removing the first carrier board before configuring the first active die or the second active die.

12. The manufacturing method of the packaging structure according to claim 10, further comprising:
before configuring the first active die or the second active die, placing the through silicon via die, the bridge die, the first encapsulant, and the redistribution circuit structure on a second carrier board, and at least locating the redistribution circuit structure between the through silicon via die and the second carrier board;
after forming the second encapsulant, removing the second carrier board.

13. The manufacturing method of the packaging structure according to claim 10, wherein the step of forming the first encapsulant comprises:
forming a first encapsulation material to cover the through silicon via die and the bridge die; and
performing a first thinning process, to remove a part of the first encapsulation material, to form a first encapsulant laterally covering the through silicon via die and the bridge die, and expose the through silicon via die and the bridge die.

14. The manufacturing method of the packaging structure according to claim 10, wherein the step of forming the second encapsulant comprises:
forming a second encapsulation material to cover the first active die, the second active die and the passive device; and
performing a second thinning process, to remove a part of the second encapsulation material, to form a second encapsulant laterally covering the first active die and the second active die, and expose the first active die and the second active die.

* * * * *

UNITED STATES PATENT AND TRADEMARK OFFICE
CERTIFICATE OF CORRECTION

PATENT NO. : 11,309,283 B2  
APPLICATION NO. : 17/099801  
DATED : April 19, 2022  
INVENTOR(S) : Shang-Yu Chang Chien Page 1 of 1

It is certified that error appears in the above-identified patent and that said Letters Patent is hereby corrected as shown below:

On the Title Page

Item (73) Assignee: should read, Powertech Technology Inc., Hsinchu County (TW)

Signed and Sealed this
Twenty-fourth Day of September, 2024

Katherine Kelly Vidal  
*Director of the United States Patent and Trademark Office*